US008729626B2

(12) United States Patent
Kosuge et al.

(10) Patent No.: US 8,729,626 B2
(45) Date of Patent: May 20, 2014

(54) SEMICONDUCTOR DEVICE WITH VERTICAL TRANSISTOR

(76) Inventors: Yu Kosuge, Tokyo (JP); Yasuhiko Ueda, Tokyo (JP)

( * ) Notice: Subject to any disclaimer, the term of this patent is extended or adjusted under 35 U.S.C. 154(b) by 671 days.

(21) Appl. No.: 12/941,252

(22) Filed: Nov. 8, 2010

(65) Prior Publication Data

US 2011/0108910 A1 May 12, 2011

(30) Foreign Application Priority Data

Nov. 10, 2009 (JP) ................................ P2009-257151

(51) Int. Cl.
*H01L 29/66* (2006.01)

(52) U.S. Cl.
USPC ............ 257/329; 257/E29.262; 257/E21.159; 257/E21.24; 257/E21.3; 257/E21.41

(58) Field of Classification Search
USPC ............ 257/329, E29.262, E21.159, E21.24, 257/E21.3, E21.41
See application file for complete search history.

(56) References Cited

U.S. PATENT DOCUMENTS

| 6,015,725 | A | 1/2000 | Hirayama |
| 7,687,351 | B2 | 3/2010 | Oyu |
| 2008/0150030 | A1 | 6/2008 | Yokoyama et al. |
| 2008/0296677 | A1 | 12/2008 | Takaishi |
| 2009/0085102 | A1 | 4/2009 | Takaishi |
| 2009/0148992 | A1* | 6/2009 | Oyu ............................. 438/268 |
| 2010/0078712 | A1* | 4/2010 | Ikebuchi et al. ............. 257/329 |
| 2010/0123170 | A1* | 5/2010 | Fujimoto ..................... 257/208 |
| 2010/0252879 | A1* | 10/2010 | Ogawa et al. ................ 257/329 |
| 2011/0006360 | A1* | 1/2011 | Ikebuchi ...................... 257/329 |
| 2011/0089394 | A1* | 4/2011 | Kakegawa ........................ 257/4 |
| 2011/0266615 | A1* | 11/2011 | Oyu et al. .................... 257/329 |

FOREIGN PATENT DOCUMENTS

| JP | 05-136374 | 6/1993 |
| JP | 3371708 | 1/2003 |
| JP | 2004-319808 | 11/2004 |
| JP | 2008-159972 | 7/2008 |
| JP | 2008-300623 | 12/2008 |
| JP | 2009-081389 | 4/2009 |
| JP | 2009-141110 | 6/2009 |

* cited by examiner

*Primary Examiner* — Bilkis Jahan
(74) *Attorney, Agent, or Firm* — Young & Thompson

(57) ABSTRACT

A semiconductor device may include, but is not limited to: a semiconductor structure extending upwardly; a first insulating film covering at least a side surface of the semiconductor structure; a gate electrode extending upwardly, the gate electrode being adjacent to the first insulating film; and an insulating structure extending upwardly, the insulating structure being adjacent to the gate electrode.

18 Claims, 6 Drawing Sheets

SEMICONDUCTOR DEVICE WITH VERTICAL TRANSISTOR

BACKGROUND OF THE INVENTION

1. Field of the Invention

The present invention relates to a semiconductor device.

Priority is claimed on Japanese Patent Application No. 2009-257151, filed Nov. 10, 2009, the content of which is incorporated herein by reference.

2. Description of the Related Art

Recently, miniaturization of planar transistors has been reaching its limit. For this reason, vertical transistors have been proposed for higher integration of semiconductor devices.

FIG. 9A is a plan view illustrating a vertical pillar transistor of a related art. FIG. 9B is a cross-sectional view taken along line B-B' shown in FIG. 9A. As shown in FIG. 9A, the vertical pillar transistor includes: a silicon substrate 101; a first silicon pillar 102 extending from a main surface 101a of the silicon substrate 101; and a second silicon pillar (dummy pillar) 104 extending from the main surface 101a of the silicon substrate 101, the second silicon pillar 104 being close to the first silicon pillar 102. An insulating film 103 for element isolation fills a recess 101c in the semiconductor substrate 101.

A gate insulating film 105 covers a side surface of the first silicon pillar 102. A gate electrode 106 covers the gate insulating film 105. An upper diffusion layer 113 partially covers an upper surface of the first silicon pillar 102. A lower diffusion layer 114 is positioned in the silicon substrate 101, adjacent to a bottom surface of the first silicon pillar 102.

An insulating film 163 covers a side surface of the second side pillar 104. A connecting electrode 160 covers the insulating film 163. The connecting electrode 160 is connected to the gate electrode 106 via a connecting portion 160c.

Although not shown, an inter-layer insulating film covers the first and second silicon pillars 102 and 104. A first contact 110 penetrates the inter-layer insulating film so as to be connected to the connecting electrode 160. A voltage can be applied to the gate electrode 106 through the contact 110.

A second contact 111 penetrates the inter-layer insulating film so as to be connected to the upper diffusion layer 113. A third contact 112 penetrates the inter-layer insulating film so as to be connected to the lower diffusion layer 114. A nitride film 175 covers an upper surface of the insulating film 103.

As shown in FIG. 9A, the first silicon pillar 102 is positioned in substantially the center of a region defined by the nitride film 175, which is substantially rectangular in plan view. The gate insulating film 105 surrounds the first silicon pillar 102. A nitride film 109, which is substantially circular in plan view, covers an upper surface of the gate insulating film 105 and a part of the upper surface of the first silicon pillar 102. The gate electrode 106 surrounds the gate insulating film 105 and the nitride film 109 in plan view.

A nitride film 172, which is substantially rectangular in plan view, covers an upper surface of the second silicon pillar (dummy pillar) 104. The connecting electrode 160 surrounds the second silicon pillar 104 and the nitride film 172 in plan view. The connecting electrode 160 is in contact with the gate electrode 106 at the connecting portion 160c. The first to third contacts 110, 111, and 112 are separately aligned on a center line of the rectangular region, which extends in the longitudinal direction. The center line passes the centers of the first to third contacts 110, 111, and 112.

As shown in FIG. 9B, an insulating film 163 insulates the second silicon pillar 104 from the connecting electrode 160. Further, the insulating film 163 and the nitride film 172 cover the upper surface of the second silicon pillar 104. For this reason, although the first contact 110 is in contact with the connecting electrode 160, the first contact 110 is insulated from the second silicon pillar 104, thereby preventing a short circuit between the first contact 110 and the second silicon pillar 104.

According to the method of the related art for manufacturing the vertical pillar transistor, however, the second silicon pillar 104 is formed close to the first silicon pillar such that the gate electrode 106 is in contact with the connecting electrode 160 by self-alignment. For this reason, it is difficult to form a contact hole for forming the first contact 110 at a predetermined position, with a predetermined size and depth. Further, the insulating film 163 and the nitride film 172 are so thin that there is little etching margin in the depth direction. For this reason, it is difficult to control a depth of the contact hole.

Consequently, the contact hole penetrates the insulating film 163 and the nitride film 172 so that the second silicon pillar is partially or fully exposed in some cases. In this case, the first contact 110 is in contact with the second silicon pillar 104, thereby causing a short circuit between the first contact 110 and the silicon substrate 101, and therefore degrading a manufacturing yield of the vertical transistor.

Japanese Patent Laid-Open Publication No. 2004-319808 discloses a method of manufacturing an MIS field-effect transistor which includes anisotropically dry-etching a PSG (Phospho-Silicate Glass) film, which is formed by chemical vapor deposition, to selectively form a via hole. Japanese Patent Laid-Open Publication No. 2008-159972 discloses a method of manufacturing a semiconductor device which includes adjusting an etching condition to adjust a height of the gate electrode. Japanese Patent Publication No. 3371708 discloses a method of manufacturing a vertical field-effect transistor which includes: forming a contact hole in an inter-layer insulating film; and forming a contact plug, which is made of tungsten or the like, so as to fill the contact hole. However, any of the related art can solve the above problems.

SUMMARY

In one embodiment, a semiconductor device may include, but is not limited to: a semiconductor structure extending upwardly; a first insulating film covering at least a side surface of the semiconductor structure; a gate electrode extending upwardly, the gate electrode being adjacent to the first insulating film; and an insulating structure extending upwardly, the insulating structure being adjacent to the gate electrode.

In another embodiment, a semiconductor device may include, but is not limited to: a semiconductor substrate; an insulating structure; a first insulating film; and a gate electrode. The semiconductor substrate has a recessed portion and a protruding portion defined by the recessed portion. The protruding portion has a first portion extending upwardly from the semiconductor substrate. The insulating structure fills the recessed portion. The insulating structure has a second portion extending upwardly. The first insulating film covers at least a side surface of the first portion. The gate electrode covers a third portion of the first insulating film and a side surface of the second portion. The third portion covers the side surface of the first portion.

In still another embodiment, a semiconductor device may include, but is not limited to: a semiconductor structure extending upwardly; an insulating film covering at least a side surface of the semiconductor structure; a gate electrode extending upwardly; an insulating structure extending upwardly; and a contact extending upwardly from the insulating structure. The gate electrode is adjacent to the insulating film. The insulating structure is adjacent to the gate electrode. The gate electrode covers a side surface of the insulating structure and a part of a side surface of the contact.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figures 1A, 1B:
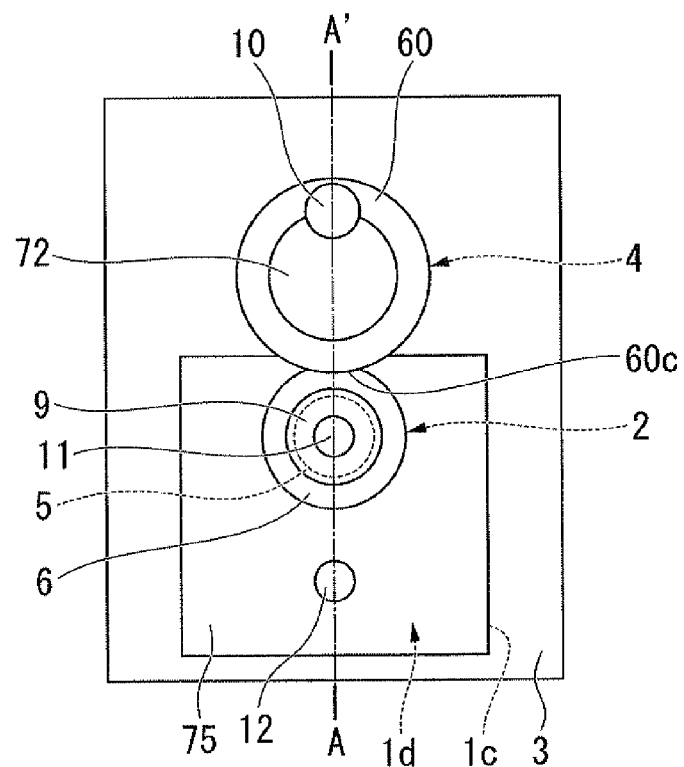
FIG. 1A is a plan view illustrating a semiconductor device according to a first embodiment of the present invention.
FIG. 1B is a cross-sectional view taken along line A-A' shown in FIG. 1A.

Hereinafter, a semiconductor device according to a first embodiment of the present invention is explained. FIG. 1A is a plan view illustrating a semiconductor device according to a first embodiment of the present invention. FIG. 1B is a cross-sectional view taken along line A-A' shown in FIG. 1A.

As shown in FIG. 1B, a vertical pillar transistor of the first embodiment is formed on a silicon substrate 1. The substrate 1 includes a recess 1c on a side of a main surface 1a of the substrate 1. A first insulating film 3 for element isolation fills the recess 1c. For example, a silicon oxide ($SiO_2$) film is used as the first insulating film 3.

An extending portion 1d of the substrate 1 is defined by the recess 1c. A first protruding portion 2, which is a part of the extending portion 1d, protrudes from the main surface 1a of the substrate 1.

A gate insulating film 5 covers a side surface of the first protruding portion 2. The gate insulating film 5 surrounds the first protruding portion 2 in plan view. A gate electrode 6 covers the gate insulating film 5. The gate electrode 6 surrounds the gate insulating film 5 in plan view.

An upper diffusion layer 13 partially covers an upper surface of the first protruding portion 2. A lower diffusion layer 14 in the substrate 1 is adjacent to a bottom portion of the first protruding portion 2. A third sidewall 9, which is substantially cylindrical, surrounds the upper diffusion layer 13. For example, a nitride film, such as a silicon oxynitride (SiON) film, is used as the third sidewall 9.

A second protruding portion 4, which is a part of the first insulating film 3, protrudes from a main surface 3a of the first insulating film 3. The second protruding portion 4 is adjacent to the first protruding portion 2. A second mask 72 covers an upper surface of the second protruding portion 4. For example, a nitride film, such as a silicon oxynitride (SiON) film, is used as the second mask 72.

The second protruding potion 4 is a part of the first insulator 3. When a silicon oxide film is used as the first insulating film 3, the second protruding portion 4 becomes a pillar made of the silicon oxide film. The second protruding portion 4 is a pillar for forming a connecting electrode 60 to be connected to a gate contact 10.

The connecting electrode 60, which is substantially cylindrical, covers a side surface of the second protruding portion 4 so as to be in contact with the gate electrode 6 at a connecting portion 60c. The connecting electrode 60 and the gate electrode 6 are made of the same metal material. The connecting electrode 60 and the gate electrode 6 may be made of different materials.

An inter-layer insulating film (not shown) covers the first and second protruding portions 2 and 4. The gate contact 10 penetrates the inter-layer insulating film so as to be in contact with the connecting electrode 60.

A first contact 11 penetrates the inter-layer insulating film so as to be in contact with the upper diffusion layer 13. A second contact 12 penetrates the inter-layer insulating film so as to be in contact with the lower diffusion layer 14. When a voltage is applied to the gate electrode 6 while voltages are applied to the upper and lower diffusion layers 13 and 14, a thin channel portion is formed in the first protruding portion 2 in a direction perpendicular to the main surface 1a of the substrate 1.

As shown in FIG. 1B, the gate contact 10 is in contact with an upper portion 60b of the connecting electrode 60. In this manner, the gate contact 10 is preferably formed so as to be in contact with the upper portion 60b of the connecting electrode 60 that surrounds the second protruding portion 4 made of the first insulating film 3. Accordingly, even if a contact hole penetrating the second mask 72 is formed by failing to control a depth of the contact hole, the first insulating film 3 is present between the gate contact 10 and the substrate 1, thereby preventing a short circuit between the gate contact 10 and the substrate 1. In other words, larger etching margin in the depth direction of the contact hole can be achieved thanks to the second protruding portion 4.

As shown in FIG. 1A, the vertical pillar transistor of the first embodiment includes the extending portion 1d defined by the first insulating film 3. The extending portion 1d is substantially rectangular in plan view.

The first protruding portion 2 is inside the extending portion 1d in plan view. The nitride film 9, which is substantially circular in plan view, covers the upper surface of the gate insulating film 5 and a part of the upper surface of the protruding portion 2. The gate insulating film 5 surrounds the protruding portion 2. The gate electrode 6 surrounds the gate insulating film 5.

The second protruding portion 4 is inside the first insulating film 3 in plan view. The second protruding portion 4 is adjacent to the first protruding portion 2. The second mask 72, which is substantially circular in plan view, covers the upper surface of the second protruding portion 4. The connecting electrode 60 surrounds the second mask 72.

The gate contact 10 and the first and second contacts 11 and 12, which are substantially circular in plan view, are separately aligned on a center line connecting the centers of the first and second protruding portions 2 and 4.

The gate contact 10 and the connecting portion 60c are symmetrical with respect to the center point of the second protruding portion 4. The position of the gate contact 10 is not limited thereto as long as the gate contact 10 is in contact with the upper portion 60b of the connecting electrode 60. Thanks to the gate contact 10, a voltage can be supplied to the gate electrode 6 through the gate contact 10. Further, a short circuit between the gate contact 10 and the substrate 1 can be prevented.

The vertical pillar transistor of the first embodiment can be applied to a transistor for a DRAM cell, a transistor for a peripheral circuit, and the like. Accordingly, a short circuit between a gate electrode and a substrate in the DRAM cell and the peripheral circuit can be prevented.

Hereinafter, a method of manufacturing the semiconductor device according to the first embodiment is explained. The method of the first embodiment includes: a first process of forming the first insulating film 3; a second process of forming the first and second masks 71 and 72; a third process of forming the first and second protruding portions 2 and 4; a fourth process of forming the lower diffusion layer 14; a fifth process of forming the gate insulating film 5; a sixth process of forming the gate electrode 6 and the connecting electrode 60; a seventh process of forming the upper diffusion layer 13 and the inter-layer insulating film (not shown); and an eighth process of forming the gate contact 10.

FIGS. 2 to 7 are cross-sectional views indicative of a process flow illustrating a method of manufacturing the semiconductor device of the first embodiment. Hereinafter, each process is explained in detail.

Figure 2:
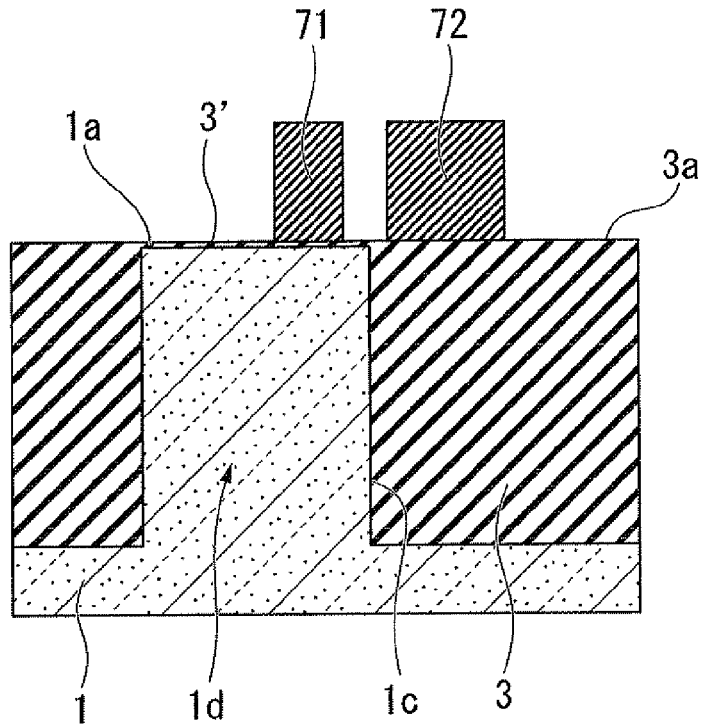
FIGS. 2 to 7 are cross-sectional views indicative of a process flow illustrating a method of manufacturing the semiconductor device according to the first embodiment.

FIG. 2 is a cross-sectional view illustrating the first and second processes. In the first process, a recess 1c is formed by an STI (Shallow Trench Isolation) method in the silicon substrate 1 at a predetermined position. Thus, the extending portion 1d is defined by the recess 1c.

Then, the first insulating film 3 filling the recess 1c is formed. A silicon oxide film and the like are used as the first insulating film 3. Thus, a region of the first insulating film 3 filling the recess 1c becomes an element isolation region (STI region).

Preferably, a bottom level of the recess 1c is deeper than a bottom level of a general STI region. This is because the first insulating film filling the recess 1c is etched in the depth direction to form the second protruding portion 4. If the depth of the recess 1c is not sufficient, the second protruding portion 4 cannot be formed with a desired height.

Then, an upper surface of the silicon substrate 1 is oxidized to form a silicon oxide film 3' having a thickness of a few nanometers. The silicon oxide film 3' is connected to the first insulating film 3. If the first insulating film 3 is made of a silicon oxide film, the silicon oxide film 3' is integrated with the first insulating film 3.

In the second process, a silicon nitride film is formed so as to cover the first insulating film 3 and the silicon oxide film 3'. Then, the silicon nitride film is patterned by lithography and etching to form the first mask 71 and the second mask 72 at predetermined positions, with predetermined sizes. The positions of the first and second masks 71 and 72 correspond to positions of the first and second protruding portions 2 and 4 to be formed. In this case, the first mask 71 is formed inside the extending portion 1d in plan view. The second mask 72 is formed inside the recess 1d in plan view.

Figure 3:
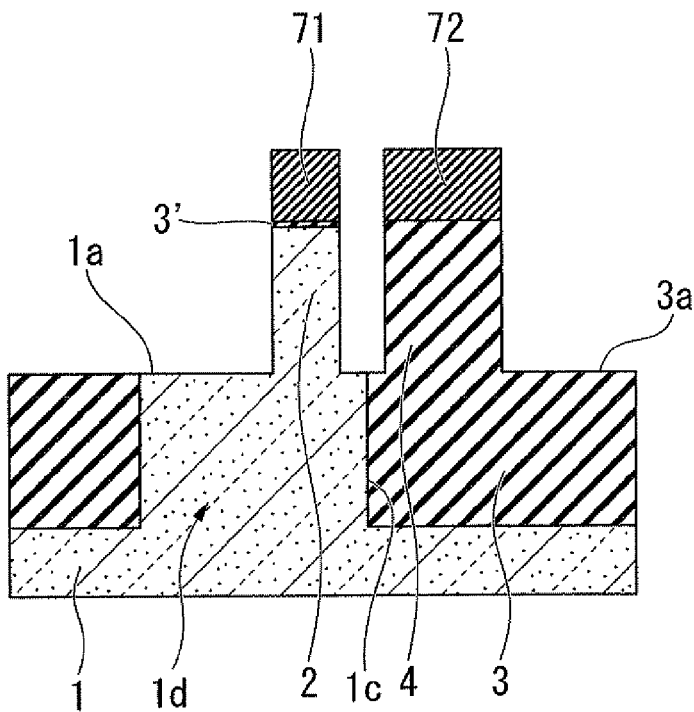

FIG. 3 is a cross-sectional view illustrating the third process. After the first and second masks 71 and 72 are formed, the substrate 1, the silicon oxide film 3', and the first insulating film 3 are anisotropic ally etched using the first and second masks 71 and 72 to form the first and second protruding portions 2 and 4. The first protruding portion 2 is a part of the silicon substrate 1. The second protruding portion 4 is a part of the first insulating film 3. At this stage, the silicon oxide film 3' remains between the first mask 71 and the first protruding portion 2.

Preferably, the first and second protruding portions 2 and 4 are simultaneously formed for simplifying the manufacturing process. However, any one of the first and second protruding portions 2 and 4 may be formed after the other one is formed.

Preferably, the first and second protruding portions 2 and 4 are formed close to each other. The second protruding portion 4 is a pillar for forming the connecting electrode 60 that supplies a voltage to the gate electrode 6 from the gate contact 10. For this reason, if a distance between the first and second protruding portions 2 and 4 is large, the horizontal size of the connecting electrode 60 has to be larger, thereby causing a reduction in power supply from the gate contact 10 to the gate electrode 6.

Figure 4:
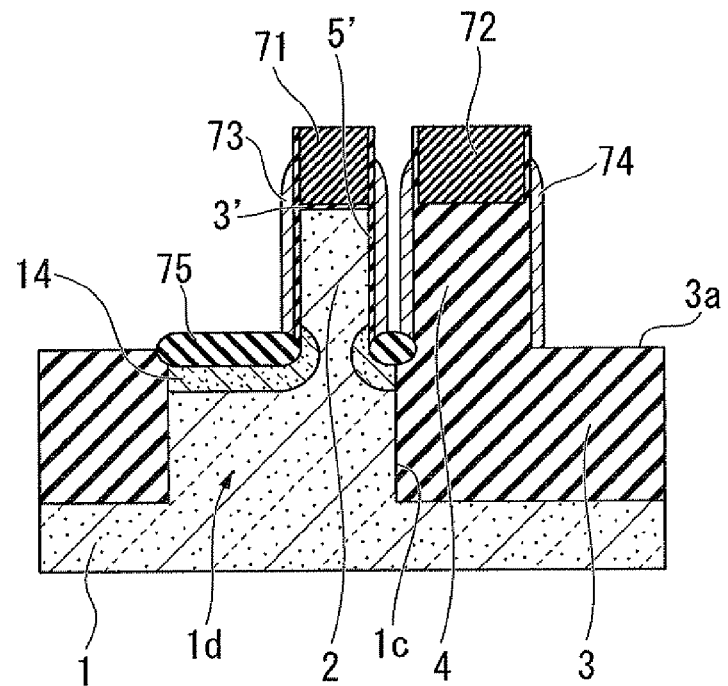

FIG. 4 is a cross-sectional view illustrating the fourth process. After the first and second protruding portions 2 and 4 are formed, a side surface of the first protruding portion 2 is oxidized to form a silicon oxide film 5'.

Then, a silicon nitride film is formed so as to cover the first and second protruding portions 2 and 4, the surface 1a of the substrate 1, and the surface 3a of the first insulating film 3. Then, the silicon nitride film is etched to form the first and second sidewalls 73 and 74 covering the side surfaces of the first and second protruding portions 2 and 4, respectively.

Then, a portion of the surface 1a of the substrate 1, which is adjacent to the bottom portion of the first protruding portion 2, is oxidized to form the silicon oxide film 75. Then, an impurity is introduced into the extending portion 1d of the substrate 1 to form the lower diffusion layer 14.

In the fifth process, the first and second sidewalls 73 and 74 are removed by wet etching after the lower diffusion layer 14 is formed. At the same time, the first and second masks 71 and 72 become thinner, and the silicon oxide film 5' is removed. Then, the gate insulating film 5, which has a thickness of a few nanometers, is formed so as to cover the side surface of the first protruding portion 2.

Figure 5:
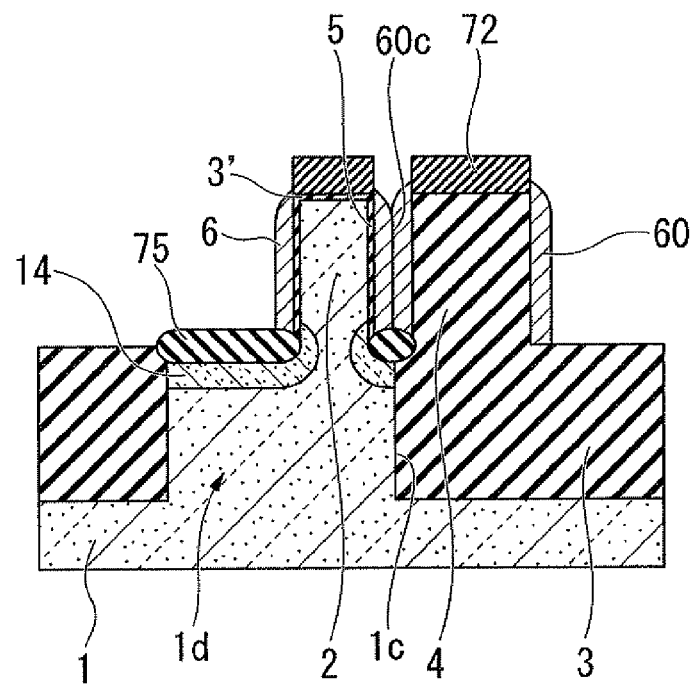

FIG. 5 is a cross-sectional view illustrating the sixth process. After the gate insulating film 5 is formed, a gate-electrode material film is formed so as to cover the first and second protruding portions 2 and 4, the surface 1a of the substrate 1, and the surface 3a of the first insulating film 3.

Then, the gate-electrode material film is etched to form the cylindrical gate electrode 6 and the cylindrical connecting electrode 60. The gate electrode 6 covers the gate insulating film 5 covering the side surface of the first protruding portion 2. The connecting electrode 60 covers the side surface of the second protruding portion 4. In this case, the connecting electrode 60 is in contact with the gate electrode 6 at the connecting portion 60c.

Figure 6:
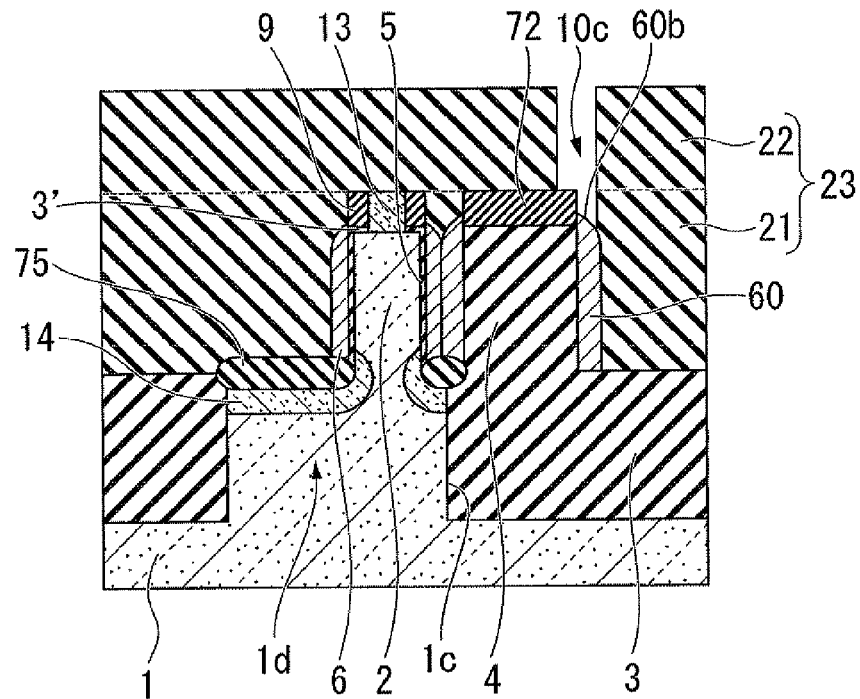

FIG. 6 is a cross-sectional view illustrating the seventh and eighth processes. After the gate electrode 6 and the connecting electrode 60 are formed, an inter-layer insulating film 21 is formed so as to cover the first and second masks 71 and 72. Then, the inter-layer insulating film 21 is planarized by CMP (Chemical Mechanical Polishing) using the second mask 72 as a stopper.

Then, an oxide film, which has a thickness of approximately 10 nm, is formed over the inter-layer insulating film 21. Then, the oxide film is etched by lithography and etching to form a hole exposing only the first mask 71.

Then, the first mask 71 is wet-etched to partially expose a top surface of the first protruding portion 2. Then, the third cylindrical sidewall 9, which is made of a nitride film, is formed over the first protruding portion 2.

Then, a silicon film is epitaxially grown from the first protruding portion 2 so as to fill the hole surrounded by the third cylindrical sidewall 9. Then, an impurity is introduced into the epitaxially-grown silicon film to form the upper diffusion layer 13.

Then, an inter-layer insulating film 22 is formed so as to cover the first and second protruding portions 2 and 4. Then, the inter-layer insulating film 22 is planarized by CMP. Hereinafter, the inter-layer insulating films 21 and 22 are collectively called an "inter-layer insulating film 23."

In the eighth process, a first contact hole 10c, which penetrates the inter-layer insulating film 23, is formed by anisotropic dry etching so as to expose the upper portion 60b of the connecting electrode 60. As shown in FIG. 6, not only the upper portion 60b of the connecting electrode 60, but also a part of the second mask 72 is exposed to the first contact hole 10c.

Figure 7:
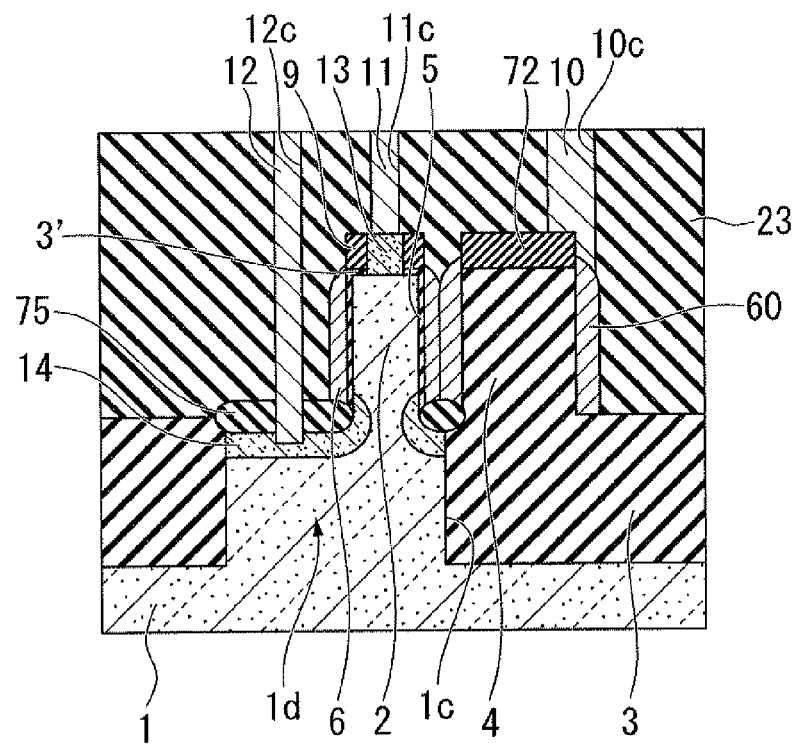

FIG. 7 is a cross-sectional view illustrating a state of the gate contact 10 and the first and second contacts 11 and 12 being formed. After the first contact hole 10c is formed, a metal film is formed to fill the first contact hole 10c. Thus, the gate contact 10 filling the first contact hole 10c is formed. The gate contact 10 is in contact with the upper portion 60b of the connecting electrode 60.

Then, a second contact hole 11c, which penetrates the inter-layer insulating film 23, is formed by anisotropic dry etching to partially expose the upper diffusion layer 13. Then, a metal film is formed so as to fill the second contact hole 11c. Thus, the first contact 11 is formed.

Then, a third contact hole 12c, which penetrates the inter-layer insulating film 23, is formed by anisotropic dry etching. Then, a metal film is formed so as to fill the third contact hole 12c. Thus, the second contact 12 is formed.

The order of forming the gate contact 10 and the first and second contacts 11 and 12 is not limited to the aforementioned order. Any of the contacts 10, 11, and 12 may be formed first. Alternatively, all the contacts 10, 11, and 12 may be formed at the same time.

Then, a wiring portion (not shown) is formed over the inter-layer insulating film 23 so as to be connected to the gate contact 10. Thus, a voltage can be supplied from the wiring portion to the gate electrode 6 via the gate contact 10 and the connecting electrode 60.

According to the semiconductor device of the first embodiment and the method of manufacturing the same, although the upper surface of the second protruding portion 4 is partially exposed by forming the contact hole 10c for forming the gate contact 10, the second protruding potion 4, which is a part of the first insulating film (i.e., an STI insulating film, such as a silicon oxide film), is present, thereby preventing a short circuit between the gate contact 10 and the substrate 1.

Second Embodiment

Figure 8A:
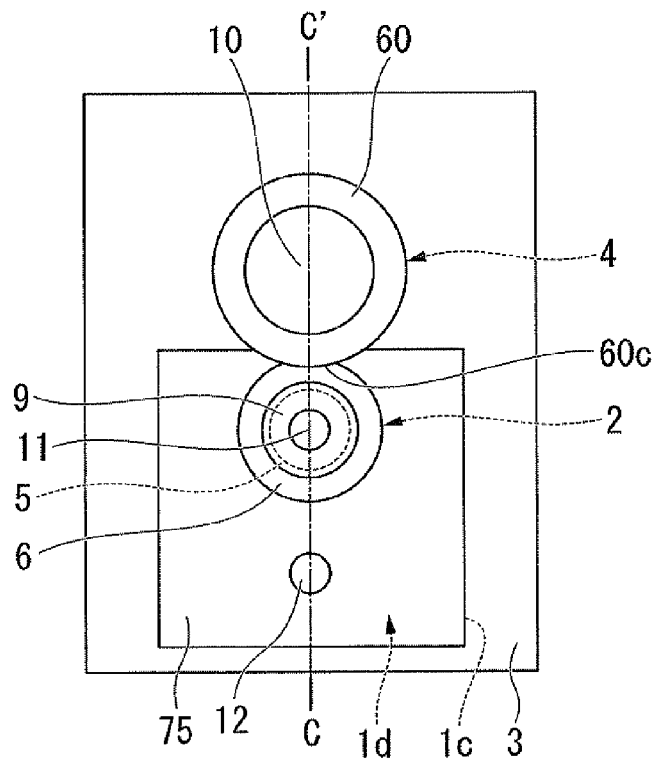
FIG. 8A is a plan view illustrating a semiconductor device according to a second embodiment of the present invention.
Figure 8B:
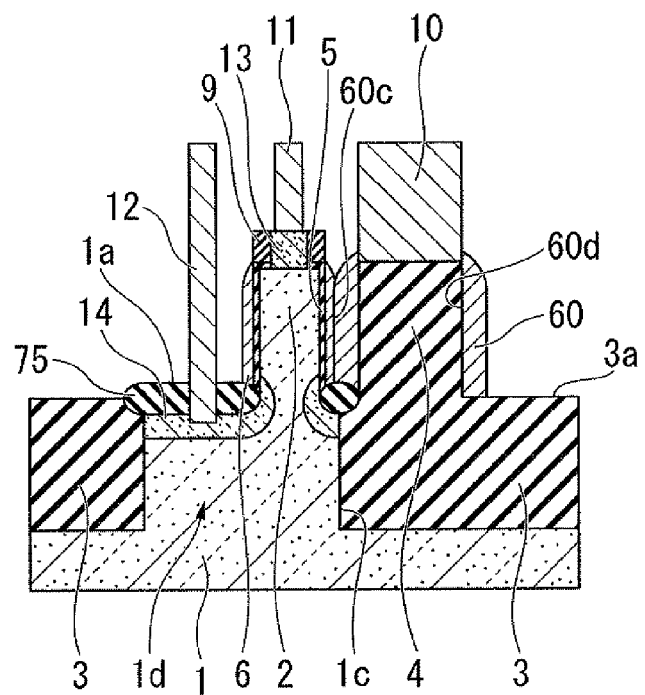
FIG. 8B is a cross-sectional view taken along line C-C' shown in FIG. 8A.
Figure 9A:
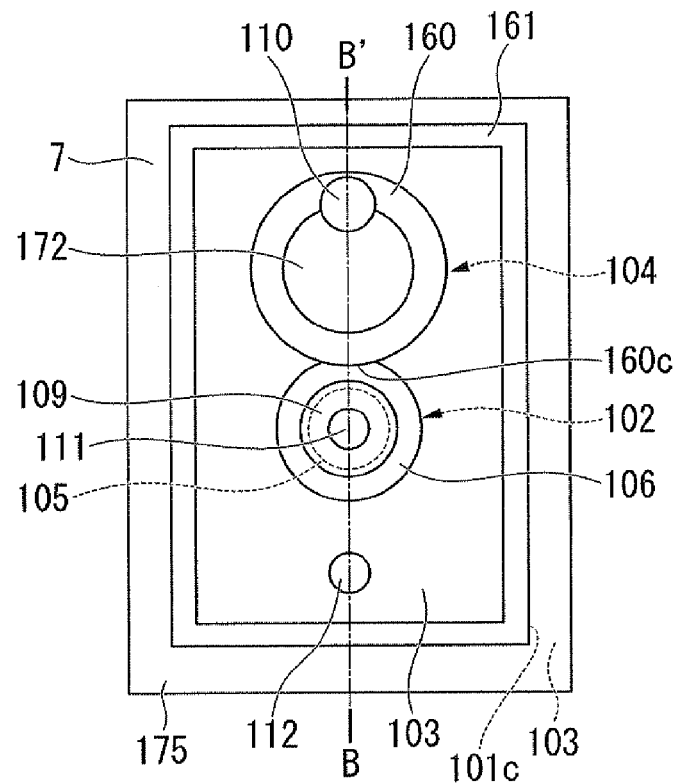
FIG. 9A is a plan view illustrating a semiconductor device of a related art.
Figure 9B:
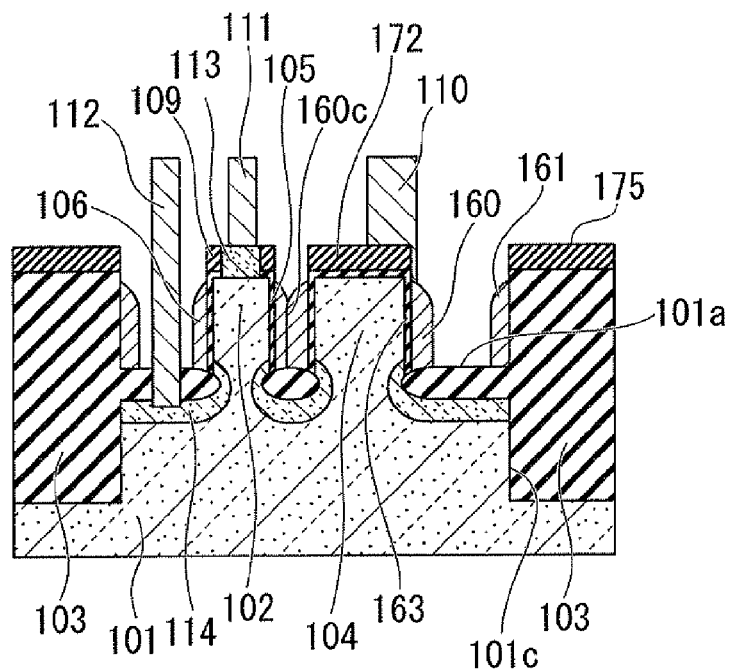
FIG. 9B is a cross-sectional view taken along line B-B' shown in FIG. 9A.

Hereinafter, a semiconductor device according to a second embodiment of the present invention is explained. FIG. 8A is a plan view illustrating a semiconductor device according to a second embodiment of the present invention. FIG. 8B is a cross-sectional view taken along line C-C' shown in FIG. 8A. Like reference numerals denote like elements between the first and second embodiments.

As shown in FIG. 8B, the second embodiment differs from the first embodiment only in that the second mask 72 is not formed, and that the gate contact 10 is formed on the upper surface of the second protruding portion 4 so as to be in contact with an inner surface of the cylindrical connecting electrode 60. Similar to the first embodiment, the second protruding portion 4 is a part of the first insulating film 3, thereby preventing a short circuit between the gate contact 10 and the substrate 1. Therefore, the same effects as those of the first embodiment can be achieved.

The present invention is applicable to semiconductor-device manufacturing industries.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, but may be modified and changed without departing from the scope and spirit of the invention.

In addition, while not specifically claimed in the claim section, the application reserves the right to include in the claim section at any appropriate time the following method.

A method of manufacturing a semiconductor device may include, but is not limited to: forming a semiconductor structure and an insulating structure separated from the semiconductor structure, the semiconductor structure and the insulating structure extending upwardly; forming a first insulating film covering at least a side surface of the semiconductor structure; and forming a gate electrode covering a side surface of the insulating structure and a first portion of the first insulating film, the first portion covering the side surface of the semiconductor structure.

The above method may further include: after forming the gate electrode, forming a second insulating film covering the semiconductor structure, the insulating structure, and the gate electrode; forming a first hole in the second insulating film to partially expose upper surfaces of the insulating structure and the gate electrode; and forming a first contact filling the first hole so that the first contact is insulated from the semiconductor structure by the insulating structure.

Regarding the method, forming the semiconductor structure and the insulating structure may include: forming a recessed portion in a semiconductor substrate to form a protruding portion surrounded by the recessed portion, the protruding portion being a part of the semiconductor substrate; forming a third insulating film filling the recessed portion; selectively etching the protruding portion and the third insulating film to form second and third portions upwardly extending from etched surfaces of the protruding portion and the third insulating film, the second portion being separated from the third portion.

The above method may further include: after forming the semiconductor structure and the insulating structure, before forming the first insulating film, introducing a first impurity into the protruding portion to form a first region adjacent to a main surface of the protruding portion and to the second portion, wherein the first insulating film covers the side surface of the semiconductor structure and the main surface of the protruding portion.

The above method may further include: after introducing the first impurity, forming a second hole in the second insulating film, a bottom surface of the second hole being in contact with the first region; forming a second contact filling the second hole.

Regarding the above method, forming the gate electrode may include: forming a first electrode film covering the first portion; and forming a second electrode film covering the side surface of the insulating structure, the second electrode film being in contact with the first electrode film, and the first and second electrode films forming the gate electrode.

The above method may further include: after forming the gate electrode, before forming the second insulating film, forming a fourth insulating film covering a top surface of the semiconductor structure; forming a third hole partially exposing the top surface of the semiconductor structure; forming an epitaxial layer filling the third hole; and introducing a second impurity into the epitaxial layer.

Regarding the above method, the epitaxial layer is formed by an epitaxial growth process.

The above method may further include: forming a fourth hole in the second insulating film to partially expose an upper surface of the epitaxial layer: and forming a third contact filling the fourth hole.

Regarding the method, selectively etching the protruding portion and the third insulating film may include: forming first and second insulating masks over the protruding portion and the third insulating film, respectively; and selectively etching the protruding portion and the third insulating film using the first and second insulating masks.

Regarding the above method, the first hole is formed while the second insulating mask covers an upper surface of the third portion.

The above method may further include: removing the second insulating mask, wherein the first hole is formed to expose an upper surface of the third portion.

What is claimed is:

1. A semiconductor device comprising:
a semiconductor structure that includes a bottom part and a top part extending upwardly from the bottom part;
a first insulating film covering at least a side surface of the top part of the semiconductor structure;
a gate electrode extending upwardly, the gate electrode being adjacent to the first insulating film; and
an insulating structure that includes a bottom part that defines the bottom part of the semiconductor structure and a top part extending upwardly from the bottom part of the insulating structure, the top part of the insulating structure being directly adjacent to a contact electrode that contacts the gate electrode.

2. The semiconductor device according to claim 1, wherein the first insulating film surrounds the semiconductor structure in plan view, and
the gate electrode surrounds the first insulating film and the contact electrode surrounds the top part of the insulating structure in plan view.

3. The semiconductor device according to claim 1, further comprising:
a first contact extending upwardly, the first contact being partially in contact with the contact electrode, and the first contact being insulated from the semiconductor structure by the insulating structure.

4. The semiconductor device according to claim 3, wherein the first contact partially overlaps the top part of the insulating structure in plan view.

5. The semiconductor device according to claim 3, wherein the semiconductor structure, the insulating structure, and the first contact are aligned in a straight line in plan view.

6. The semiconductor device according to claim 5, wherein the insulating structure is positioned between the semiconductor structure and the first contact in plan view.

7. The semiconductor device according to claim 1, further comprising:
an epitaxial layer on an upper surface of the semiconductor structure.

8. The semiconductor device according to claim 7, further comprising:
a second insulating film covering a side surface of the epitaxial layer, the second insulating film partially covering the upper surface of the semiconductor structure.

9. The semiconductor device according to claim 7, further comprising:
a second contact extending upwardly from the epitaxial layer, a bottom surface of the second contact being in contact with the epitaxial layer.

10. The semiconductor device according to claim 9, wherein the semiconductor structure, the insulating structure, and the second contact are aligned in a straight line in plan view.

11. A semiconductor device comprising:
a semiconductor substrate having a recessed portion and a protruding portion defined by the recessed portion, the protruding portion having a first portion extending upwardly from the protruding portion;
an insulating structure filling the recessed portion, the insulating structure having a second portion extending upwardly;
a first insulating film covering at least a side surface of the first portion; and
a gate electrode covering a side surface of the first insulating film and a contact electrode covering a side surface of the second portion, the contact electrode directly contacting the gate electrode.

12. The semiconductor device according to claim 11, further comprising:
a first contact extending upwardly, the first contact being partially in contact with the contact electrode, and the first contact being insulated from the semiconductor substrate by the insulating structure.

13. The semiconductor device according to claim 11, wherein the first contact partially overlaps the second portion in plan view.

14. The semiconductor device according to claim 11, wherein the first portion, the second portion, and the first contact are aligned in a straight line in plan view.

15. The semiconductor device according to claim 14, wherein the second portion is positioned between the first portion and the first contact in plan view.

16. The semiconductor device according to claim 11, wherein the semiconductor substrate has a main surface and a first region adjacent to the main surface and to the first portion, the first region having a first impurity.

17. The semiconductor device according to claim 16, further comprising:
a second contact extending upwardly, a bottom surface of the second contact being in contact with the first region.

18. The semiconductor device according to claim 17, wherein the first and second portions and the second contact are aligned in a straight line in plan view.

\* \* \* \* \*